(12) United States Patent
Hopkins et al.

(10) Patent No.: US 11,450,601 B2
(45) Date of Patent: Sep. 20, 2022

(54) ASSEMBLIES COMPRISING MEMORY CELLS AND SELECT GATES

(71) Applicant: Micron Technology, Inc., Boise, ID (US)

(72) Inventors: John D. Hopkins, Meridian, ID (US); George Matamis, Eagle, ID (US)

(73) Assignee: Micron Technology, Inc., Boise, ID (US)

(*) Notice: Subject to any disclaimer, the term of this patent is extended or adjusted under 35 U.S.C. 154(b) by 21 days.

(21) Appl. No.: 16/574,417

(22) Filed: Sep. 18, 2019

(65) Prior Publication Data

US 2021/0082806 A1     Mar. 18, 2021

(51) Int. Cl.
| | |
|---|---|
| *H01L 21/76* | (2006.01) |
| *H01L 27/11* | (2006.01) |
| *H01L 21/768* | (2006.01) |
| *H01L 27/11582* | (2017.01) |
| *H01L 27/11556* | (2017.01) |
| *H01L 23/522* | (2006.01) |
| *H01L 23/528* | (2006.01) |
| *H01L 27/11565* | (2017.01) |
| *H01L 27/11519* | (2017.01) |
| *H01L 27/11524* | (2017.01) |
| *H01L 27/1157* | (2017.01) |

(52) U.S. Cl.
CPC ...... *H01L 23/5226* (2013.01); *H01L 23/5283* (2013.01); *H01L 27/1157* (2013.01); *H01L 27/11519* (2013.01); *H01L 27/11524* (2013.01); *H01L 27/11556* (2013.01); *H01L 27/11565* (2013.01); *H01L 27/11582* (2013.01)

(58) Field of Classification Search
CPC ......... H01L 21/76877; H01L 21/76802; H01L 23/5226; H01L 23/528; H01L 23/5283; H01L 27/11565; H01L 27/11556; H01L 27/11575; H01L 27/11529
See application file for complete search history.

(56) References Cited

U.S. PATENT DOCUMENTS

| | | | |
|---|---|---|---|
| 10,475,804 B1* | 11/2019 | Nishikawa | ........ H01L 27/11524 |
| 2003/0013298 A1* | 1/2003 | May | .................. H01L 21/7682 |
| | | | 438/666 |
| 2006/0231884 A1* | 10/2006 | Yonemochi | ....... H01L 29/40114 |
| | | | 257/314 |
| 2008/0308898 A1* | 12/2008 | Gabric | ............. H01L 21/02274 |
| | | | 257/522 |
| 2009/0091038 A1* | 4/2009 | Chen | .................. H01L 23/5222 |
| | | | 257/773 |
| 2011/0171823 A1* | 7/2011 | Hussein | ............ H01L 23/53223 |
| | | | 438/622 |

(Continued)

*Primary Examiner* — Brian Turner
(74) *Attorney, Agent, or Firm* — Wells St. John P.S.

(57) ABSTRACT

Some embodiments include an assembly having a memory stack which includes dielectric levels and conductive levels. A select gate structure is over the memory stack. A trench extends through the select gate structure. The trench has a first side and an opposing second side, along a cross-section. The trench splits the select gate structure into a first select gate configuration and a second select gate configuration. A void is within the trench and is laterally between the first and second select gate configurations. Channel material pillars extend through the memory stack. Memory cells are along the channel material pillars.

39 Claims, 9 Drawing Sheets

(56) References Cited

U.S. PATENT DOCUMENTS

| | | | | |
|---|---|---|---|---|
| 2013/0001682 A1* | 1/2013 | Tang | ................ | H01L 21/02532 |
| | | | | 257/331 |
| 2013/0032873 A1* | 2/2013 | Kiyotoshi | ......... | H01L 27/11582 |
| | | | | 257/324 |
| 2013/0320459 A1* | 12/2013 | Shue | .................... | H01L 27/088 |
| | | | | 257/392 |
| 2014/0042518 A1* | 2/2014 | Shim | .................... | H01L 29/401 |
| | | | | 257/321 |
| 2016/0260726 A1* | 9/2016 | Shin | ................ | H01L 21/823462 |
| 2016/0315081 A1* | 10/2016 | Park | .................... | H01L 29/0847 |
| 2017/0179154 A1* | 6/2017 | Furihata | ............ | H01L 21/76802 |
| 2017/0358593 A1* | 12/2017 | Yu | .................... | H01L 27/11582 |
| 2019/0164767 A1* | 5/2019 | Hong | ................ | H01L 21/02192 |
| 2019/0296012 A1* | 9/2019 | Iwata | .................. | H01L 29/0847 |
| 2020/0185408 A1* | 6/2020 | Song | ................ | H01L 21/31116 |
| 2020/0303397 A1* | 9/2020 | Cui | .................. | H01L 27/11565 |
| 2021/0005617 A1* | 1/2021 | Kai | .................. | H01L 27/11524 |

* cited by examiner

ASSEMBLIES COMPRISING MEMORY CELLS AND SELECT GATES

TECHNICAL FIELD

Assemblies comprising memory cells and select gates; such as assemblies comprising drain-side select gates (SGDs) over NAND memory cells. Methods of forming integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Figure 1:
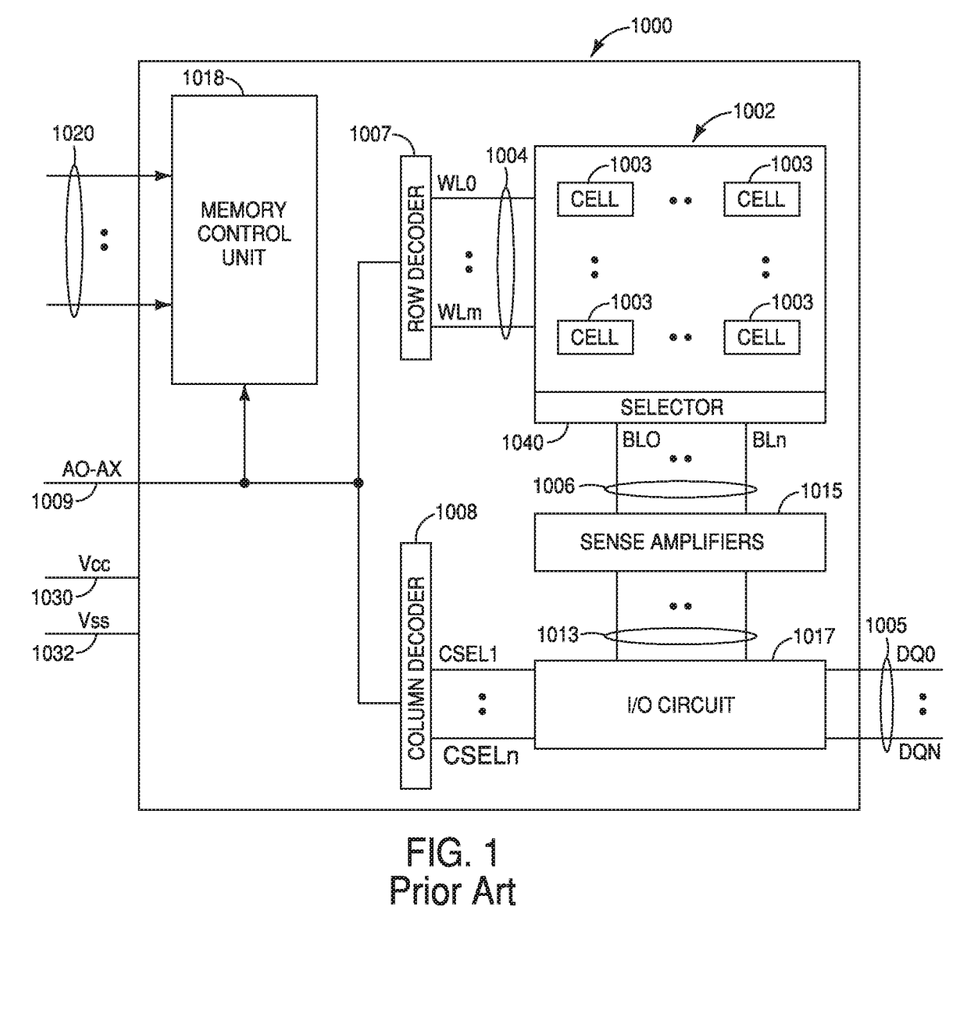
FIG. 1 shows a block diagram of a prior art memory device having a memory array with memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

Figure 2:
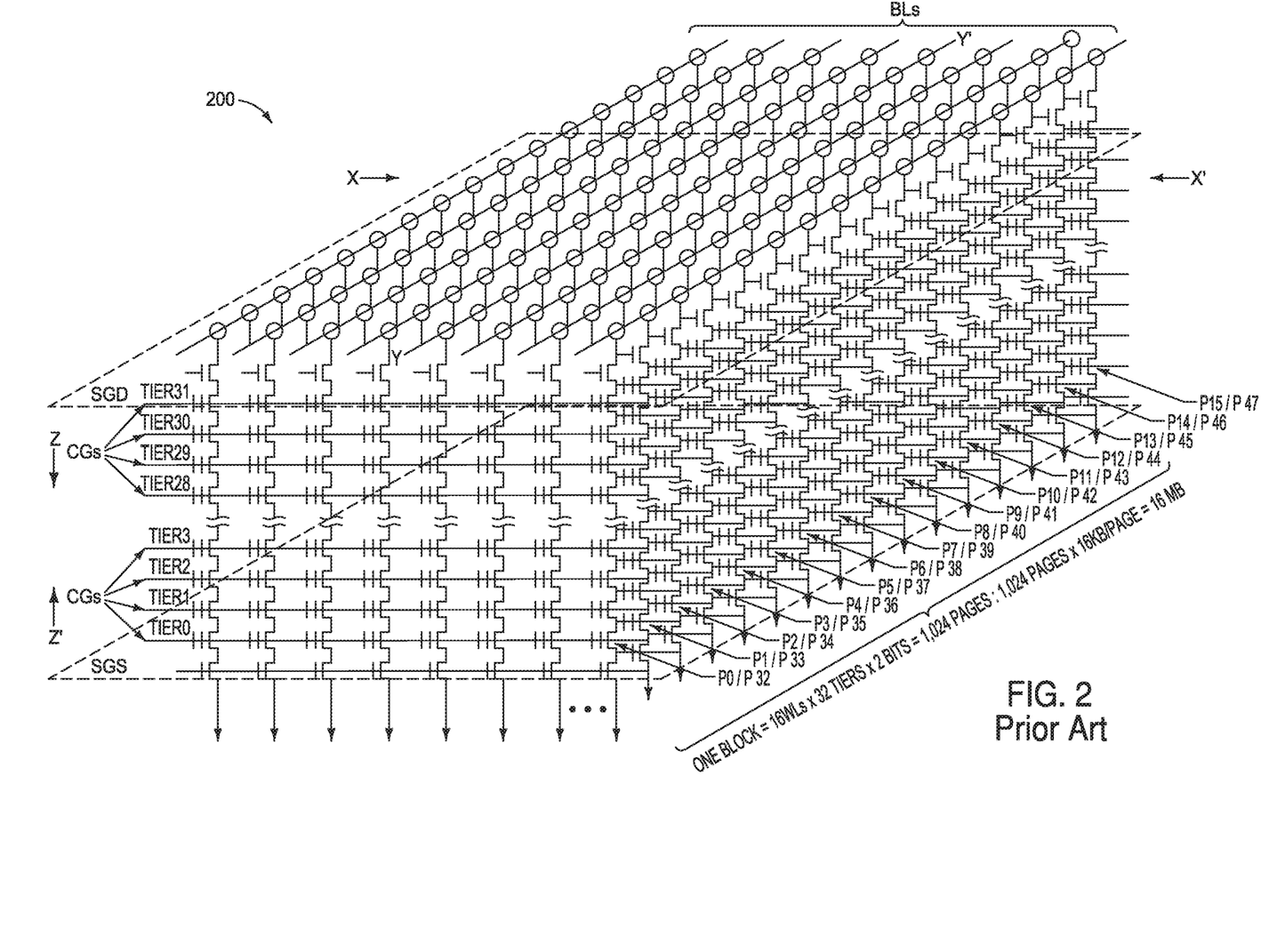
FIG. 2 shows a schematic diagram of the prior art memory device of FIG. 1 in the form of a 3D NAND memory device.

The memory array 1002 of FIG. 1 may be a NAND memory array, and FIG. 2 shows a schematic diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

Figure 3:
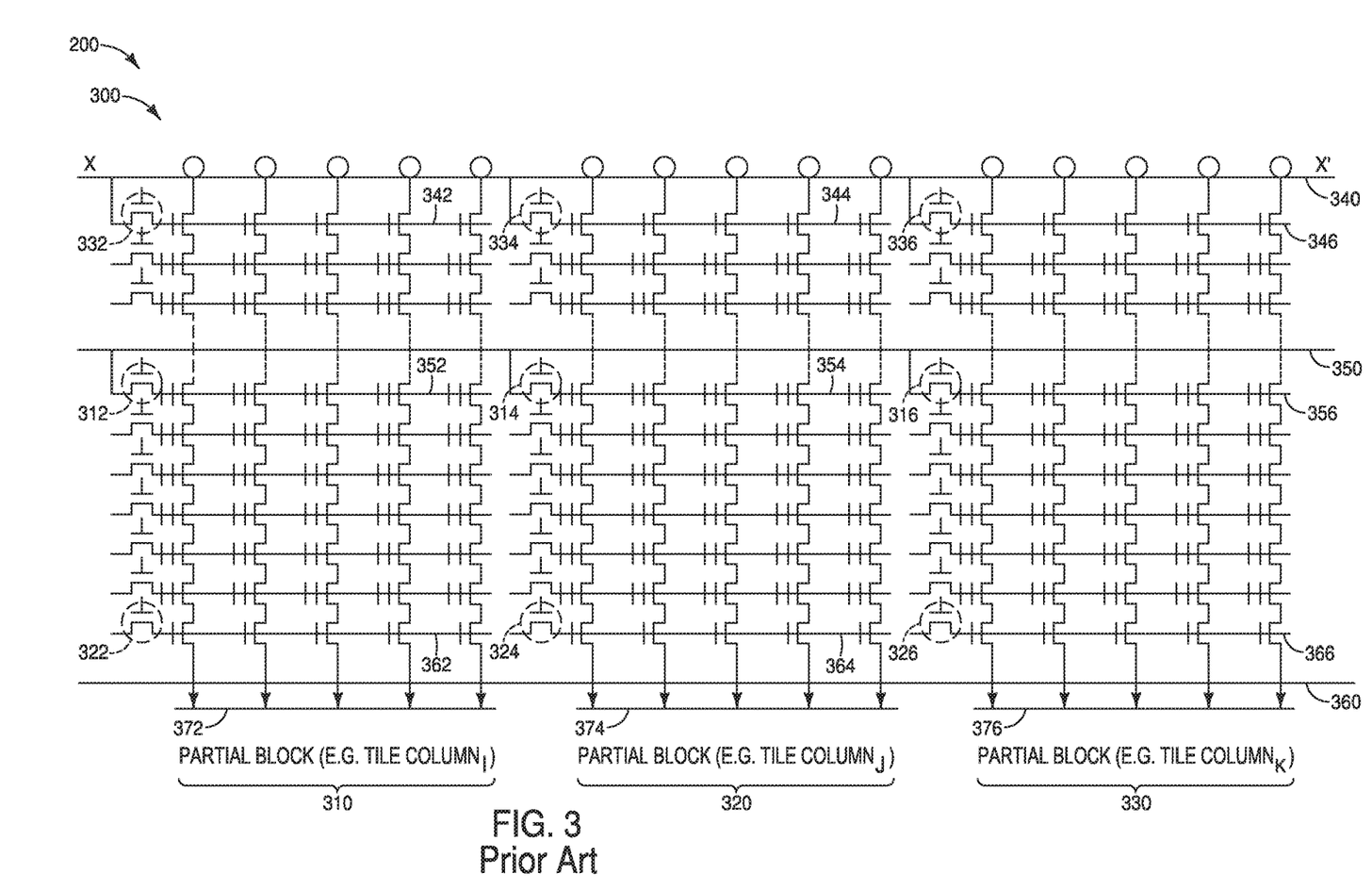
FIG. 3 shows a cross-sectional view of the prior art 3D NAND memory device of FIG. 2 in an X-X' direction.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column', tile column$_J$ and tile column$_K$, with each subset (e.g., tile column) comprising a "partial block" (sub-block) of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

Figure 4:
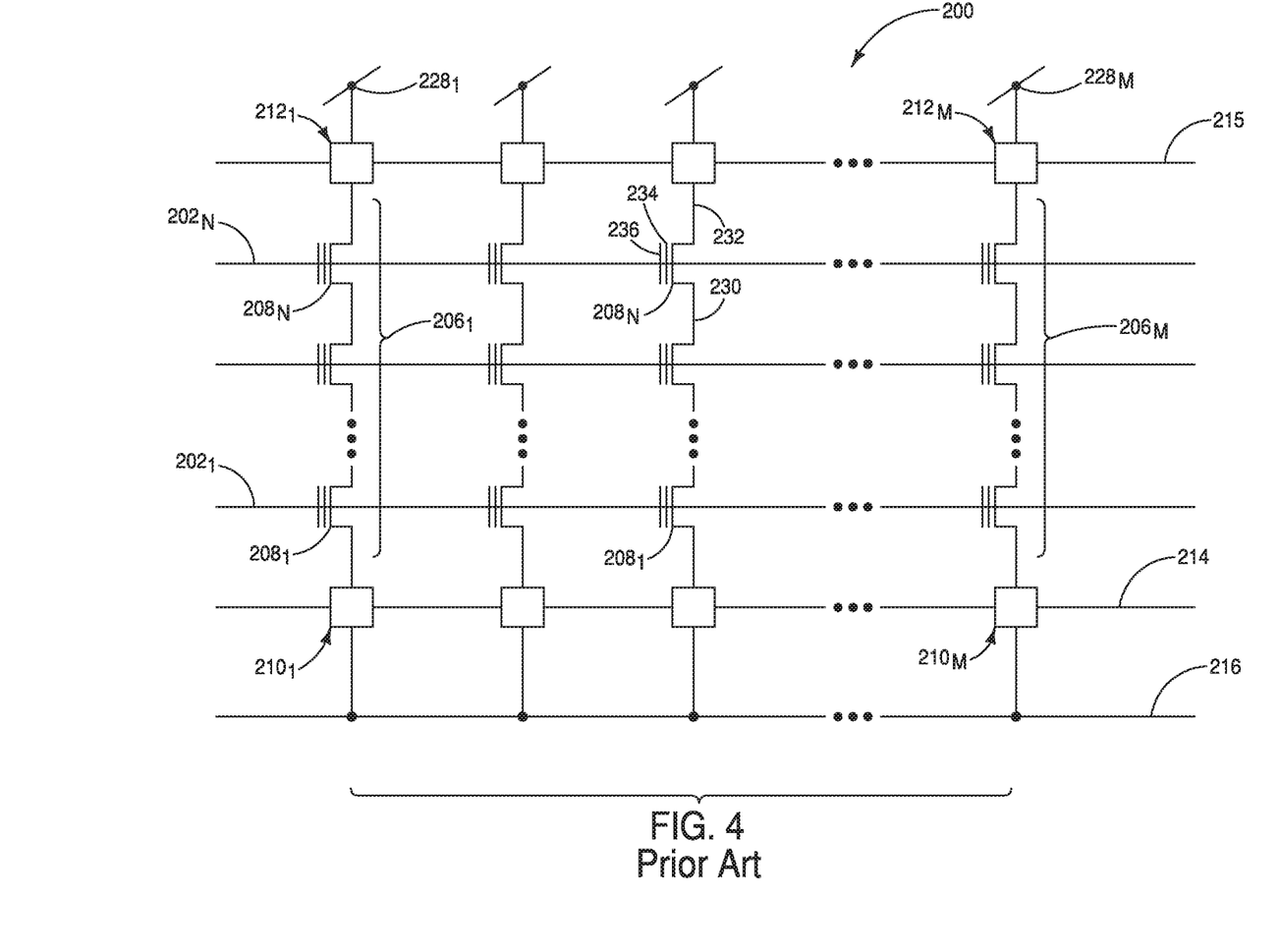
FIG. 4 is a schematic diagram of a prior art NAND memory array.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It is desired to develop improved NAND architecture.

DETAILED DESCRIPTION OF THE ILLUSTRATED EMBODIMENTS

Some embodiments include new architectures comprising drain-side select gates (SGDs). Example embodiments are described with reference to FIGS. 5-8.

Figure 5:
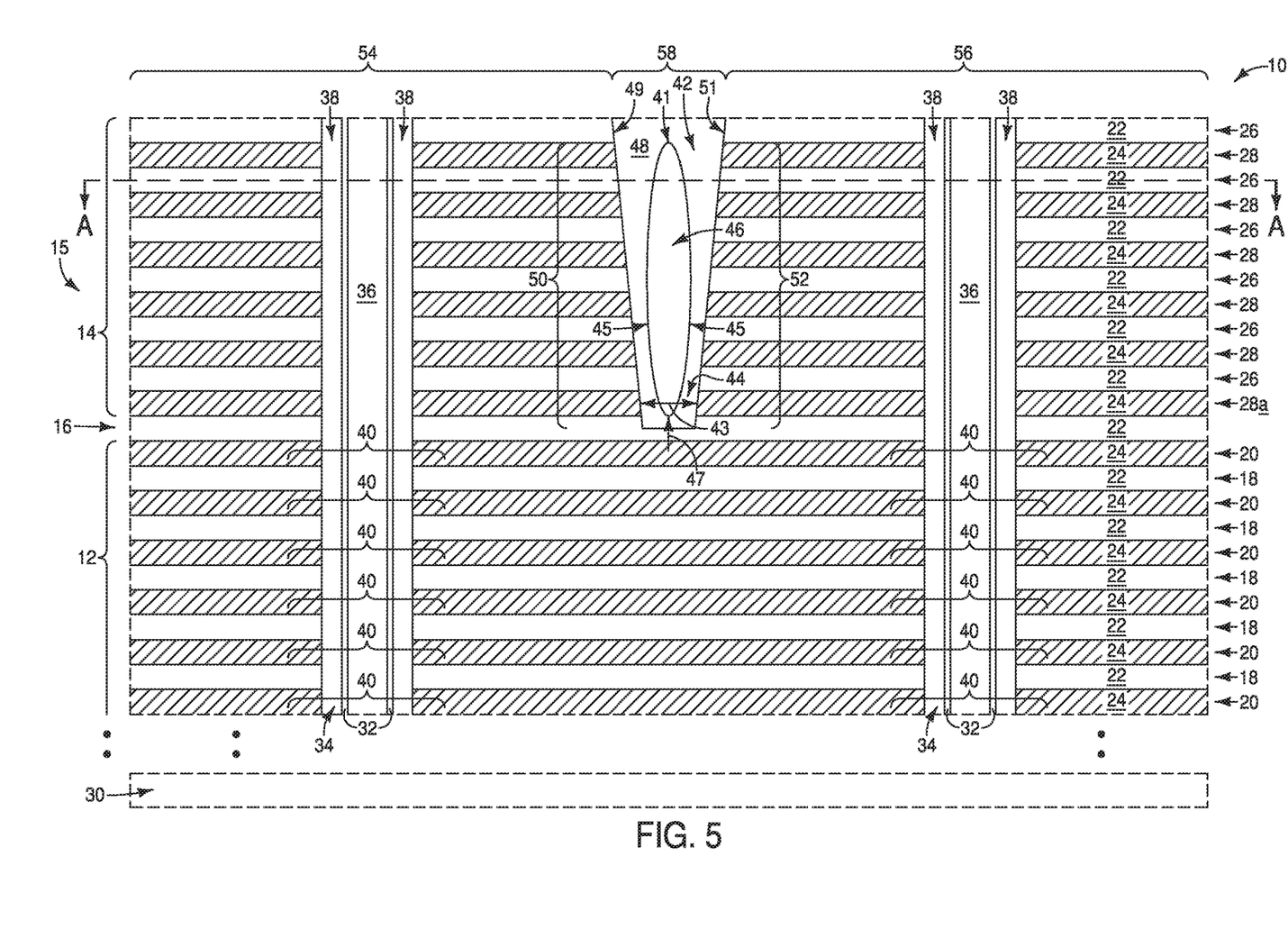
FIG. 5 is a diagrammatic cross-sectional side view of a region of an integrated assembly showing a region of an example NAND memory array.
Figure 5A:
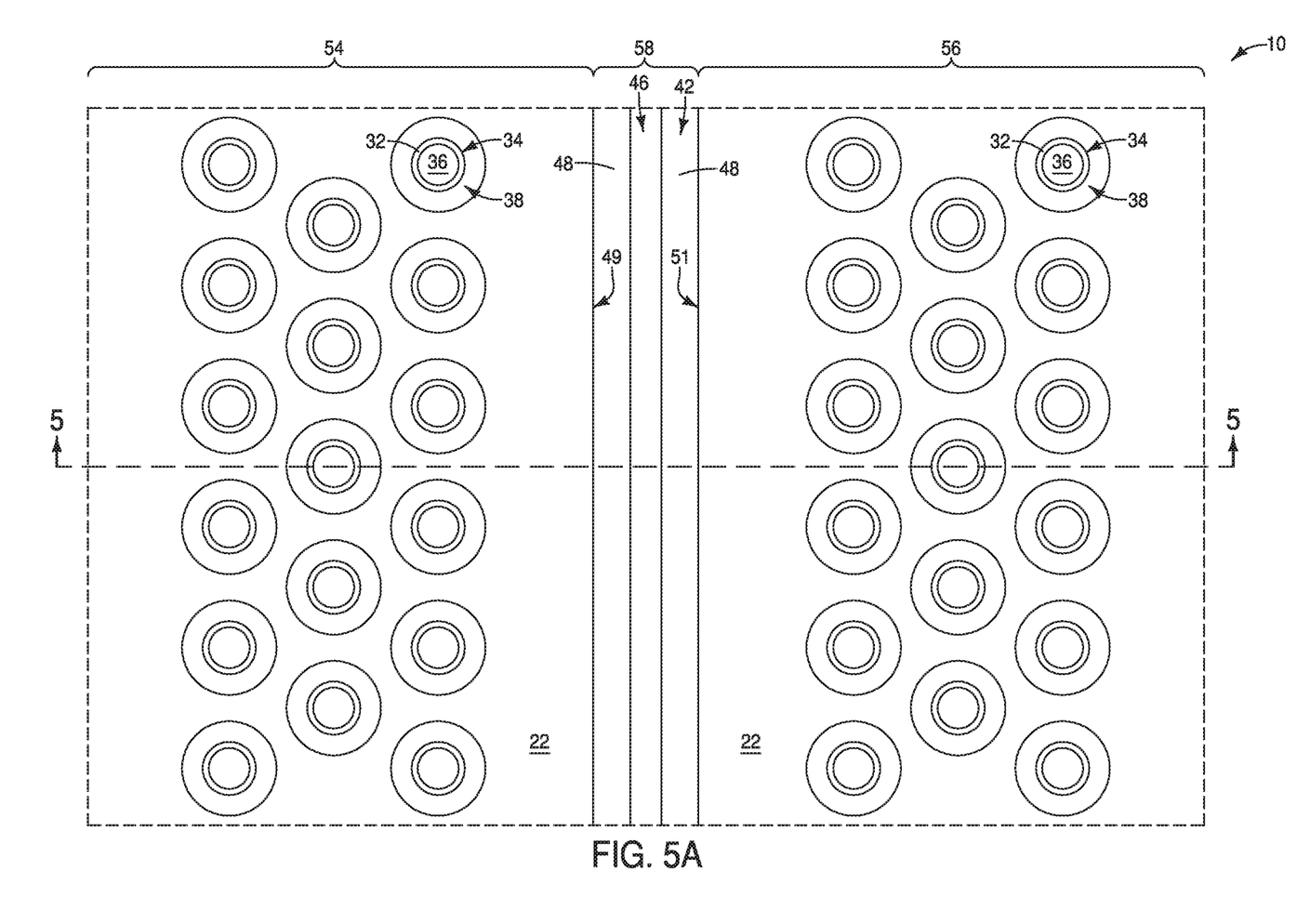
FIG. 5A is a diagrammatic top-down view along the line A-A of FIG. 5, and further illustrates the region of the example NAND memory array. The cross-sectional view of FIG. 5 is along the line 5-5 of FIG. 5A.

Referring to FIGS. 5 and 5A, an integrated assembly (construction, architecture, arrangement, etc.) 10 includes a memory stack 12, and a select gate structure 15 over the memory stack. An insulative level 16 is between the select gate structure 15 and the memory stack 12.

In the illustrated embodiment, the memory stack 12 comprises alternating dielectric levels 18 and conductive levels 20.

The dielectric levels 18 comprise dielectric material 22. The dielectric material 22 may comprise any suitable composition(s); and in some embodiments may comprise, consist essentially of, or consist of silicon dioxide.

The conductive levels 20 comprise conductive material 24. Such conductive material may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 24 may comprise a tungsten core at least partially surrounded by titanium nitride.

The levels 18 and 20 may be of any suitable thicknesses; and may be the same thickness as one another, or different thicknesses relative to one another. In some embodiments, the levels 14 and 16 may have thicknesses within a range of from about 10 nanometers (nm) to about 300 nm.

In some embodiments, the conductive levels 20 may be referred to as wordline/control gate levels, in that they include wordlines and control gates associated with vertically-stacked memory cells of NAND strings. The number of memory cell levels in individual strings may be determined by the number of conductive levels 20. The NAND strings may comprise any suitable number of memory cell levels. For instance, the NAND strings may have 8 memory cell levels, 16 memory cell levels, 32 memory cell levels, 64 memory cell levels, 512 memory cell levels, 1024 memory cell levels, etc.

In the illustrated embodiment, the insulative level 16 comprises the same dielectric material 22 as the levels 18. In other embodiments, the insulative level 16 may comprise a different dielectric material than the levels 18.

The select gate structure 15 includes a stack 14 of alternating dielectric levels 26 and conductive levels 28. In some embodiments, the stack 12 may be considered to be a first stack of alternating first dielectric levels 18 and first conductive levels 20; and the select gate structure stack 14 may be considered to be a second stack of alternating second dielectric levels 26 and second conductive levels 28.

In the illustrated embodiment, the second dielectric levels 26 comprise the same dielectric material 22 as the first dielectric levels 18; and the second conductive levels 28 comprise the same conductive material 24 as the first conductive levels 20. In other embodiments, the second dielectric levels 26 may comprise different dielectric material than the first dielectric levels 18, and/or the second conductive levels 28 may comprise a different conductive material than the first conductive levels 20.

The dielectric levels 26 and the conductive levels 28 may comprise the same thicknesses described above relative to the dielectric levels 20 and the conductive levels 18.

The embodiment of FIG. 5 shows the select gate structure stack 14 comprising 6 of the conductive levels 28. It is to be understood that the select gate structure stack 14 may comprise any suitable number of the conductive levels 28. In some embodiments, the select gate structure stack may comprise fewer than the illustrated 6 conductive levels 28 (and specifically may comprise from 1 to 5 of the conductive levels); or may comprise more than the illustrated 6 conductive levels 28. In some example embodiments, the number of conductive levels 28 within the select gate structure stack 14 may be within a range of from 2 to 10.

The memory stack 12 is shown to be supported by a base 30. The base 30 may comprise semiconductor material; and may, for example, comprise, consist essentially of, or consist of monocrystalline silicon. The base 30 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 30 may correspond to a semiconductor substrate containing one or more materials associated with integrated circuit fabrication. Such materials may include, for example, one or more of refractory metal materials, barrier materials, diffusion materials, insulator materials, etc.

A gap is provided between the memory stack 12 and the base 30 to indicate that other components and materials may be provided between the stack 12 and the base 30. Such other components and materials may comprise additional levels of the stack, a source line level, source-side select gates (SGSs), etc.

Channel material 32 extends through the memory stack 12. The channel material may also extend at least partially into the select gate structure 15, and in the shown embodiment extends through the select gate structure stack 14. The channel material forms channel material pillars 34.

The channel material 32 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some example embodiments, the channel material 32 may comprise, consist essentially of, or consist of appropriately-doped silicon.

In the illustrated embodiment, the channel material pillars 34 are annular rings surrounding insulative material 36. Such configuration of the channel material pillars may be considered to correspond to a "hollow" channel configuration, with the dielectric material 36 being provided within the hollows of the channel material pillars. In other embodiments, the channel material may be configured as solid pillars, rather than being configured as the illustrated hollow pillars.

The channel material pillars 34 are spaced from the conductive levels 18 of the stack 12 by intervening regions 38. The regions 38 may comprise tunneling material, charge-storage material, charge-blocking material and dielectric-barrier material. The tunneling material (also referred to as gate dielectric material) may comprise any suitable composition(s); and in some embodiments may comprise one or more of silicon dioxide, aluminum oxide, hafnium oxide, zirconium oxide, etc. The charge-storage material may comprise any suitable composition(s); and in some embodiments may comprise floating gate material (e.g., polysilicon) or charge-trapping material (e.g., one or more of silicon nitride, silicon oxynitride, conductive nanodots, etc.). The charge-blocking material may comprise any suitable composition(s); and in some embodiments may comprise one or more of silicon dioxide, aluminum oxide, hafnium oxide, zirconium oxide, etc. The dielectric-barrier material may comprise any suitable composition(s); and in some embodiment may comprise one or more of aluminum oxide, hafnium oxide, zirconium oxide, etc.

Memory cells (e.g., NAND memory cells) 40 are along the channel material pillars 34. The memory cells 40 include regions of the conductive levels 20 (specifically, control gate regions), portions of the channel material 32, and portions of the tunneling material, charge-storage material, charge-blocking material and dielectric-barrier material within the intervening regions 38. The memory cells 40 are vertically-stacked one atop another. In some embodiments, the assembly 10 may be considered to comprise a three-dimensional NAND configuration (three-dimensional memory device) analogous to the configuration described above with reference to FIG. 2.

A trench 42 extends through the select gate structure 15 (i.e., the second stack 14) and to the insulative level 16. In the shown embodiment, the trench 42 extends partially into the insulative level 16.

One of the conductive levels 28 of the stack 14 is a lowermost (bottommost) level 28a. In the illustrated embodiment, the trench 42 tapers along the cross-section of FIG. 5, and is narrower as it passes through the lowermost level 28a than at the top of the trench. In other embodiments, the trench 42 may have other configurations, and may or may not have the illustrated tapered configuration.

In the illustrated embodiment, the trench 42 may be considered to comprise a gap 44 where it passes through the lowermost level 28a. The trench 42 has a lateral dimension 43 across the gap 44. Such lateral dimension is a minimal cross-sectional dimension of the trench along a conductive level of the stack 14 along the cross-section of FIG. 5.

A void 46 is within the trench 42. The void 46 may correspond to a region filled with gas (e.g., air, $N_2$, Ar, etc.). The void 46 may be considered to comprise a top 41, a bottom 47, and sidewalk 45 extending between the top and bottom. The void 46 may extend at least partially across the gap 44, and in the shown embodiment extends entirely across the gap 44.

An insulative composition 48 extends across the top 41 of the void 46 to seal the void. In the illustrated embodiment, the insulative composition also extends along the bottom 47 of the void 46, and along the sidewalls 45 of the void.

The insulative composition 48 may comprise any suitable composition(s); and in some embodiments may comprise silicon dioxide. It may be advantageous for the insulative composition 48 to be a low-k composition (i.e., to have a dielectric constant (k) less than that of silicon dioxide, and specifically less than about 3.9). In some embodiments, the insulative composition 48 may comprise porous silicon dioxide (i.e., silicon dioxide having low density, and having a dielectric constant less than about 3.9). In some embodiments, the insulative composition 48 may comprise porous silicon nitride. In some embodiments, the insulative composition 48 may comprise silicon dioxide doped with one or more of carbon, boron and phosphorus; and having a dielectric constant less than about 3.9. Such doped silicon dioxide may or may not be porous.

In the illustrated embodiment, the void 46 is the only void within the trench 42 along the cross-section of FIG. 5. In other embodiments, two or more voids may be provided within the trench 42 along an analogous cross-section.

The trench 42 has a pair of opposing sidewalls (sides) 49 and 51 along the cross-sectional view of FIG. 5. The sidewalls 49 and 51 may be referred to as a first sidewall (first side) and a second sidewall (second side), respectively.

The conductive levels 28 along the first side 49 may be incorporated into a first select gate configuration 50, and the conductive levels 28 along the second side 51 may be incorporated into a second select gate configuration 52. The first select gate configuration 50 may be a drain-side select gate (SGD) associated with a first sub-block 54, and the second select gate configuration 52 may be an SGD associated with a second sub-block 56. The individual conductive lines 28 of the first select gate configuration 50 may be coupled to another (ganged together) to form a sub-SGD line analogous to the sub-SGD lines described above; and similarly the individual conductive lines 28 of the second select gate configuration 52 may be coupled one another (ganged together) to form a sub-SGD line.

The channel material pillars 34 on the illustrated left side (first side 49) of the trench 42 are together associated with (comprised by) the first sub-block 54, and the channel material pillars 34 on the illustrated right side (second side 51) of the trench 42 are together associated with (comprised by) the second sub-block 56.

The trench 42 may be considered to comprise an intervening region 58 which laterally spaces the first and second select gate configurations 50 and 52 from one another. Such intervening region includes the void 46.

A difficulty encountered in conventional NAND architectures can be that it is becoming difficult to scale the NAND architectures to higher levels of integration, in part due to difficulties associated with maintaining suitable electrical isolation of neighboring select gate configurations. Specifically, as NAND architectures are scaled to higher levels of integration, it may be desired to reduce the spacing between neighboring select gate configurations. The reduced spacing may lead to parasitic coupling and/or other problematic interactions between the neighboring select gate configurations. The embodiment of FIGS. 5 and 5A advantageously includes a low-dielectric region (low-k region) 58 between the neighboring select gate configurations 50 and 52. The void 46 provides low-k-properties, and the insulative composition 48 may further provide low-k properties. In some embodiments, a minimal gap between conductive levels of the neighboring select gate configurations 50 and 52 (i.e., the gap 44 in the illustrated configuration of FIG. 5) may be less than or equal to about 50 nm, less than or equal to about 40 nm, less than or equal to about 30 nm, or even less than or equal to about 20 nm; without problematic interactions (e.g., undesired parasitic capacitive coupling and/or other breakdown of isolation) between the neighboring select gate configurations 50 and 52. Such may provide an improvement relative to prior art architectures in that it is generally desirable to maintain relatively large gaps between conductive levels of neighboring select gate configurations in conventional architectures in order to alleviate or prevent capacitive coupling and/or other problematic interactions.

The improved integration (i.e., higher levels of integration) which may be achieved utilizing the low-k-intervening region 58 may enable memory architectures (e.g., NAND architectures) to be formed with greater packing of memory cells 40 as compared to conventional architectures. Such may enable adjacent channel material pillars 34 to be more tightly packed across a region of semiconductor real estate as compared to conventional configurations. Such may enable more memory to be packed across a region of semiconductor real estate as compared to conventional configurations, which may improve process margins as compared to the conventional configurations.

FIG. 5 shows an example configuration of the void 46 within the trench 42. Other example configurations are described with reference to FIGS. 6-8.

Figure 6:
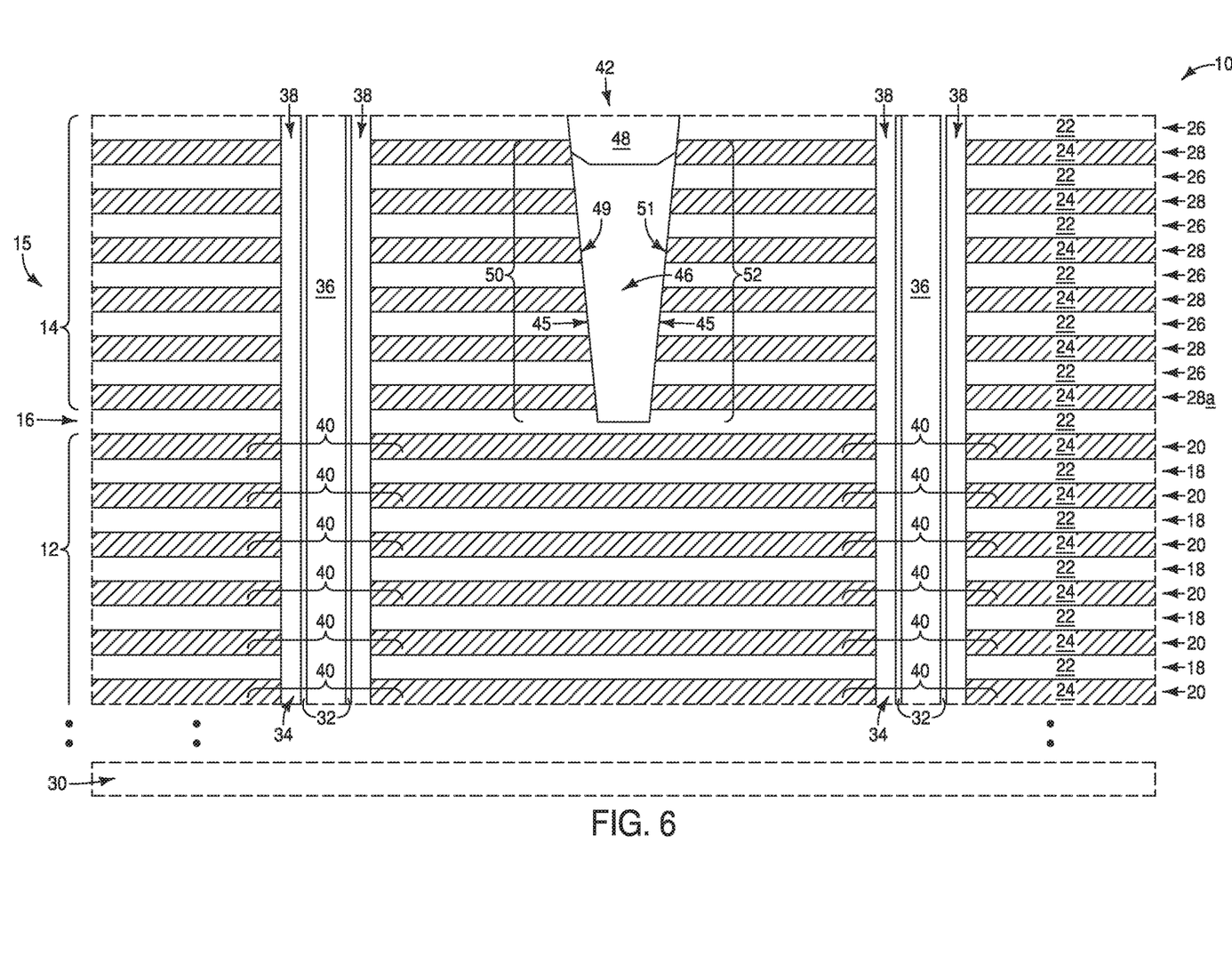
FIG. 6 is a diagrammatic cross-sectional side view of a region of another integrated assembly showing a region of another example NAND memory array.

FIG. 6 shows a configuration in which the void 46 is directly adjacent the conductive levels 28 along the sidewalls 49 and 51 of the trench 42, and in which the insulative composition 48 is only along a top of the void 46. The configuration of FIG. 6 shows the insulative composition 48 overlapping an uppermost of the conductive levels 28 of the select gate structure 15.

Figure 7:
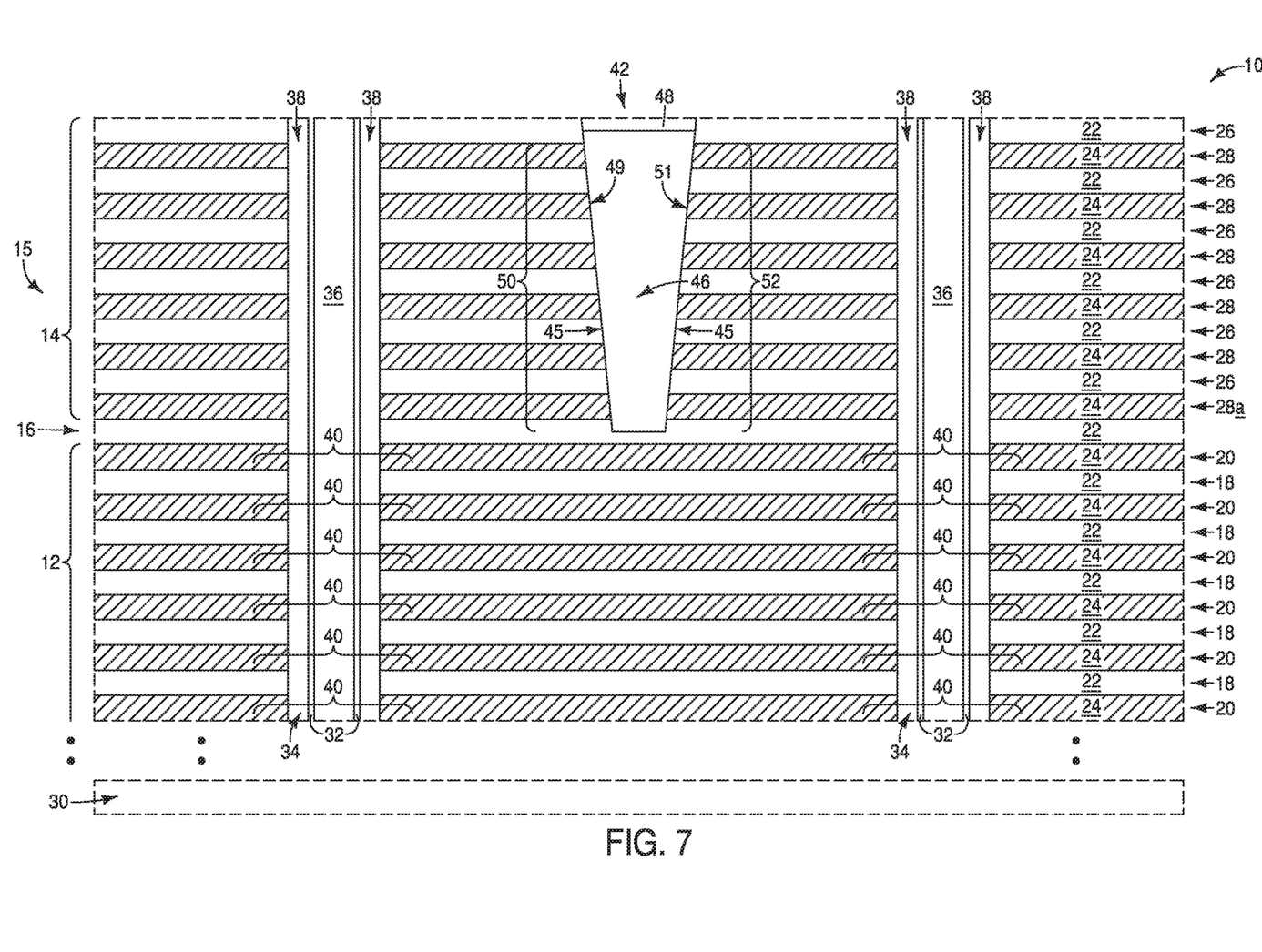
FIG. 7 is a diagrammatic cross-sectional side view of a region of another integrated assembly showing a region of another example NAND memory array.

FIG. 7 shows a configuration similar to that of FIG. 6, but shows the insulative composition 48 being entirely above all of the conductive levels 28.

Figure 8:
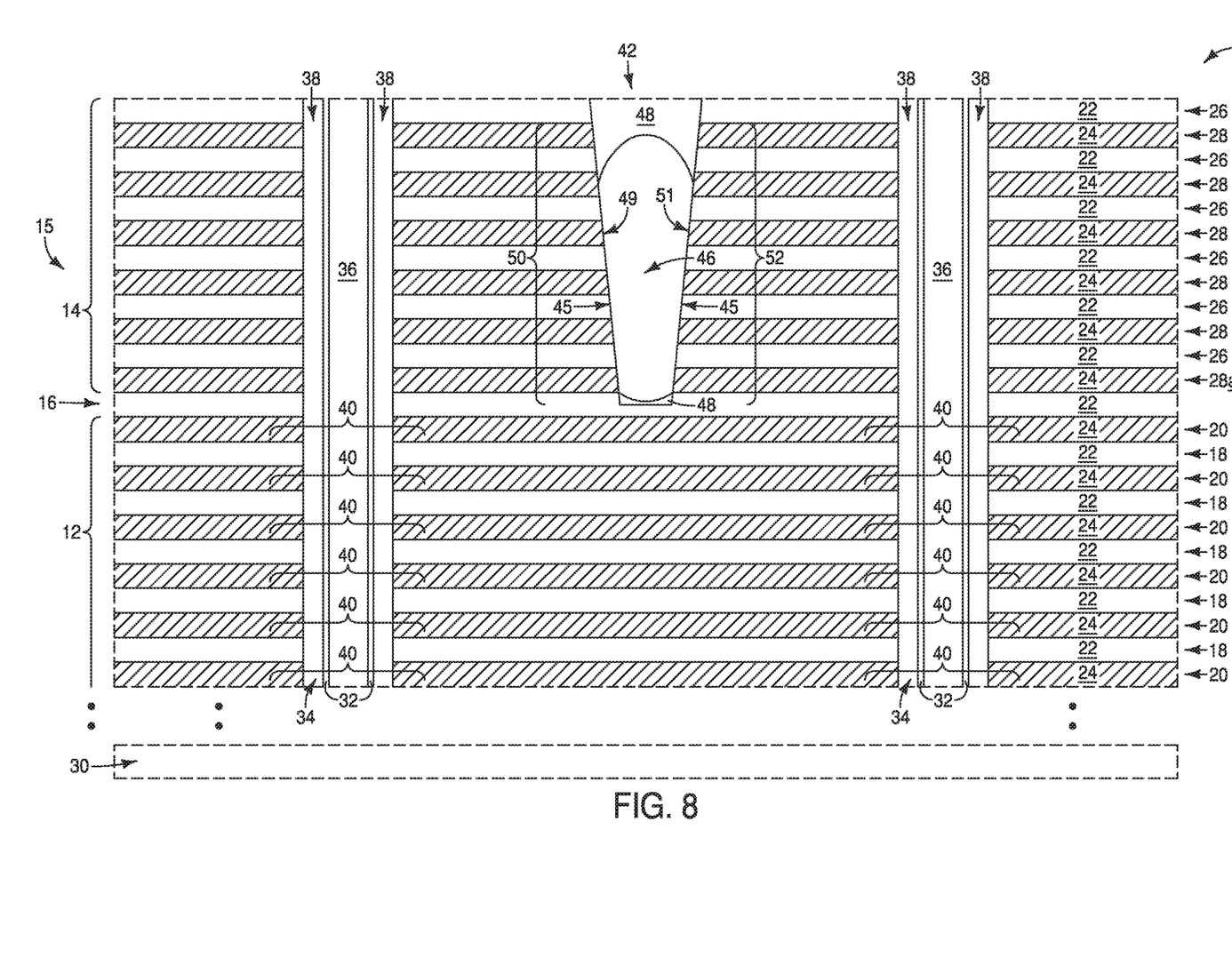
FIG. 8 is a diagrammatic cross-sectional side view of a region of another integrated assembly showing a region of another example NAND memory array.

FIG. 8 shows a configuration in which the insulative composition 48 is along a top of the void 46, and along a bottom of the void 46, but is not along sidewalls 45 of the void 46. Instead, the sidewalls of the void 46 are directly against the conductive levels 28 and the insulative levels 26 of the select gate stack 14.

An advantage of having the void 46 filling a substantial portion of the trench 42 is that the void 46 will generally have a lower dielectric constant than any other material which may be formed within the trench 42. Accordingly, in some embodiments it is to be understood that the more of the trench 42 that can be filled with the void 46, the lower the overall dielectric constant within the trench, and the better the electrical isolation between the neighboring select gate configurations 50 and 52.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an assembly having a memory stack which includes dielectric levels and conductive levels. A select gate structure is over the memory stack. A trench extends through the select gate structure. The trench has a first side and an opposing second side, along a cross-section. The trench splits the select gate structure into a first select gate configuration and a second select gate configuration. A void is within the trench and is laterally between the first and second select gate configurations. Channel material pillars extend through the memory stack. Memory cells are along the channel material pillars.

Some embodiments include an assembly which includes a first stack comprising alternating first dielectric levels and first conductive levels. An insulative level is over the first stack. A second stack is over the insulative level. The second stack comprises alternating second dielectric levels and second conductive levels. Channel material pillars extend through the first stack. Some of the channel material pillars are associated with a first sub-block and others of the channel material pillars are associated with a second sub-block. Memory cells are along the channel material pillars. A trench extends through the second stack. The trench has a first side and an opposing second side, along a cross-section, A first select gate configuration is along the first side of the trench and is associated with the first sub-block. A second select gate configuration is along the second side of the trench and is associated with the second sub-block. The first and second select gate configurations include the second conductive levels of the second stack. The first and second select gate configurations are laterally spaced from one another by an intervening insulative region along the cross-section. The intervening insulative region includes a void.

Some embodiments include an assembly which includes a first stack comprising alternating first dielectric levels and first conductive levels. An insulative level is over the first stack. A select gate configuration is over the insulative level. The select gate configuration includes a second stack comprising alternating second dielectric levels and second conductive levels, One of the second conductive levels is a lowermost of the second conductive levels. Channel material pillars extend through the first stack and into the second stack. Some of the channel material pillars are associated with a first sub-block and others of the channel material pillars being associated with a second sub-block, Memory cells are along the channel material pillars. A trench extends through the second stack, but not entirely through the insulative level. The trench, along a cross-section, has a first side and an opposing second side. The trench includes a gap through the lowermost of the second conductive levels. The gap has a lateral dimension along the cross-section of no greater than about 50 nm. A void is within the trench and extends at least partially across the gap.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An assembly, comprising:
 a memory stack comprising dielectric levels and conductive levels;
 a select gate structure over the memory stack;
 a layer of material against the select gate structure and against the memory stack, the layer of material comprising a dielectric composition different from a dielectric composition of the dielectric levels of the memory stack;
 a trench extending through the select gate structure; the trench having a first side and an opposing second side along a cross-section; the trench splitting the select gate structure into a first select gate configuration and a second select gate configuration;

a void within the trench and laterally between the first and second select gate configurations;
channel material pillars extending through the memory stack;
memory cells along the channel material pillars; and
wherein the trench and the void are sealed by a structure configured entirely as a planar structure.

2. The assembly of claim 1 wherein the void is the only void within the trench along the cross-section.

3. The assembly of claim 1 wherein the structure comprises an insulative composition.

4. The assembly of claim 3 wherein the insulative composition comprises a dielectric constant of less than about 3.9.

5. The assembly of claim 4 wherein the insulative composition comprises porous silicon dioxide.

6. The assembly of claim 4 wherein the insulative composition comprises silicon dioxide doped with one or more of boron and phosphorus.

7. The assembly of claim 1 wherein the void is filled with $N_2$.

8. The assembly of claim 1 wherein the void is filled with Ar.

9. The assembly of claim 1 wherein the first side of the trench defines a periphery portion of the void.

10. The assembly of claim 1 wherein the first and second sides of the trench define periphery portions of the void.

11. The assembly of claim 1 wherein at least one of the dielectric levels and the conductive levels define a periphery portion of the void.

12. The assembly of claim 1 wherein the trench comprises one of the following minimal gap dimensions between conductive levels of the first and second select gate configuration: less than or equal to 40 nm;
less than or equal to 30 nm; or
less than or equal to 20 nm.

13. The assembly of claim 1 wherein the void defines an entire bottom portion of the trench.

14. The assembly of claim 1 wherein the void defines the trench except a topmost portion.

15. The assembly of claim 1 wherein the trench comprises a bottommost surface in the layer of material.

16. An assembly, comprising:
a first stack comprising alternating first dielectric levels and first conductive levels;
an insulative level over the first stack;
a second stack over the insulative level; the second stack comprising alternating second dielectric levels and second conductive levels;
channel material pillars extending through the first stack; some of the channel material pillars being associated with a first sub-block and others of the channel material pillars being associated with a second sub-block;
memory cells along the channel material pillars;
a trench extending through the second stack; the trench having a first side and an opposing second side, along a cross-section, at least one of the alternating second dielectric levels and second conductive levels comprising a portion of the first side of the trench;
a first select gate configuration along the first side of the trench and associated with the first sub-block;
a second select gate configuration along the second side of the trench and associated with the second sub-block;
the first and second select gate configurations including the second conductive levels of the second stack; and
the first and second select gate configurations being laterally spaced from one another by an intervening insulative region along the cross-section; the intervening insulative region including a void and an insulative composition along only a top of the void, a bottommost surface of the insulative composition comprising a planar surface parallel with alternating levels of the second stack.

17. The assembly of claim 16 wherein the channel material pillars extend at least partially through the second stack.

18. The assembly of claim 16 wherein at least an upper region of the void is sealed with the insulative composition.

19. The assembly of claim 18 wherein the insulative composition is above the void and is not beneath the void.

20. The assembly of claim 18 wherein the insulative composition comprises silicon dioxide.

21. The assembly of claim 18 wherein the insulative composition comprises porous silicon dioxide.

22. The assembly of claim 18 wherein the insulative composition comprises porous silicon nitride.

23. The assembly of claim 18 wherein the insulative composition comprises silicon dioxide doped with one or more of carbon, boron and phosphorus.

24. The assembly of claim 16 wherein the trench includes a gap; wherein the void extends into the gap; and wherein the gap has a lateral dimension of less than or equal to about 30 nm along the cross-section.

25. The assembly of claim 24 wherein the lateral dimension is less than or equal to about 20 nm.

26. The assembly of claim 16 comprising at least five of the second conductive levels.

27. The assembly of claim 16 comprising at least six of the second conductive levels.

28. The assembly of claim 16 wherein the memory cells are NAND memory cells.

29. The assembly of claim 16 wherein the void is filled with $N_2$ or Ar.

30. The assembly of claim 16 wherein at least one of the alternating second dielectric levels and the second conductive levels comprises a periphery portion of the void.

31. The assembly of claim 16 wherein the trench comprises one of the following minimal lateral dimensions: less than or equal to 40 nm;
less than or equal to 30 nm; or
less than or equal to 20 nm.

32. The assembly of claim 16 wherein the trench narrows in lateral dimensions as the trench extends downwardly.

33. The assembly of claim 16 wherein the insulative level comprises a dielectric composition different from a dielectric composition of the first dielectric levels of the first stack.

34. The assembly of claim 16 wherein the insulative level is against the first stack and against the second stack, the trench extends into the insulative level.

35. The assembly of claim 16 wherein the insulative level comprises a dielectric composition different from a dielectric composition of the first dielectric levels of the first stack, and the trench extends into the insulative level.

36. An assembly, comprising:
a memory stack comprising dielectric levels and conductive levels;
a select gate structure over the memory stack;
a void filled with gas and extending through the select gate structure and spaced from the memory stack by a composition of material different from compositions of material of the dielectric and conductive levels; the void splitting the select gate structure into a first select gate configuration and a second select gate configuration; the void narrows as the void extends downward through the select gate structure;

channel material pillars extending through the memory stack;

memory cells along the channel material pillars; and wherein the composition of material contacts the memory stack and contacts the select gate structure.

37. The assembly of claim 36 wherein the void comprises one of the following minimal lateral dimensions: less than or equal to 40 nm;

less than or equal to 30 nm; or less than or equal to 20 nm.

38. The assembly of claim 36 further comprising a planar structure sealing an upper portion of the void.

39. An assembly, comprising:

a memory stack comprising dielectric levels and conductive levels;

a select gate structure over the memory stack;

a void filled with gas and extending through the select gate structure_and spaced from the memory stack by a composition of material different from compositions of material of the dielectric and conductive levels; the void splitting the select gate structure into a first select gate configuration and a second select gate configuration; the void narrows as the void extends downward through the select gate structure;

channel material pillars extending through the memory stack;

memory cells along the channel material pillars; and a planar structure sealing an upper portion of the void.

* * * * *